US005874695A

United States Patent [19]

Tracy

[11] Patent Number: 5,874,695

[45] Date of Patent: Feb. 23, 1999

[54] SPEAKER ASSEMBLY

[76] Inventor: Dennis A. Tracy, 4304 Elenda St., Culver City, Calif. 90230-4127

[21] Appl. No.: 856,120

[22] Filed: May 14, 1997

[51] Int. Cl.$^{6}$ ....................................................... H05K 5/00

[52] U.S. Cl. .......................... 181/147; 181/155; 181/156

[58] Field of Search .................................... 181/144, 145, 181/146, 147, 154, 155, 156, 166, 199; 381/89, 90, 158, 160, 186, 188, 205

[56] References Cited

U.S. PATENT DOCUMENTS

| | | | |
|---|---|---|---|
| 1,904,199 | 4/1933 | Brewer . | |
| 2,757,751 | 8/1956 | Tavares . | |
| 3,065,816 | 11/1962 | Ranger | 181/144 |
| 4,051,919 | 10/1977 | Buettner . | |
| 4,147,229 | 4/1979 | Flashman . | |
| 4,256,922 | 3/1981 | Gorike | 181/144 |
| 4,373,606 | 2/1983 | Clements et al. | 181/199 |
| 4,421,200 | 12/1983 | Ferralli | 181/144 |
| 4,424,416 | 1/1984 | Fukuoka | 181/146 |
| 4,454,927 | 6/1984 | Seebinger . | |
| 4,509,184 | 4/1985 | Yanagawa | 181/144 |
| 4,754,250 | 6/1988 | Duin . | |
| 4,944,019 | 7/1990 | Watanabe | 181/145 |
| 5,278,361 | 1/1994 | Field | 181/145 |
| 5,359,158 | 10/1994 | Queen . | |
| 5,451,726 | 9/1995 | Haugum . | |
| 5,512,714 | 4/1996 | Fenton . | |

*Primary Examiner*—Khanh Dang

*Attorney, Agent, or Firm*—Aquilino & Welsh

[57] ABSTRACT

A speaker assembly is disclosed. The speaker assembly employs a unique design permitting reduction in the size and weight of the speaker assembly, while maintaining high fidelity sound. The speaker incorporates inverted midranges, with opposed tweeters to produce high fidelity stereo sound. The speaker assembly also includes a strain relief member which reduces the weight of the speaker assembly. The speaker assembly also includes a pair of inductors with securing bolts running therethrough to increase the efficiency of the induction coils and permit the inductors to function as structural spacer.

19 Claims, 2 Drawing Sheets

SPEAKER ASSEMBLY

BACKGROUND OF THE INVENTION

1. Field of the Invention

The invention relates to a speaker assembly. More particularly, the invention relates to a speaker assembly with reduced size and weight to enhance the performance of the speaker assembly within aircrafts.

2. Description of the Prior Art

The current global community has made it possible for people from around the country, and around the world, to interact for both business and personal reasons. For many people, this requires that they spend considerable time traveling from one location to another location. More often than not, these people travel in aircrafts.

Whether these people travel in private or commercial aircrafts, they desire high quality entertainment during the many hours they spend within the confines of an aircraft. However, while high quality entertainment, for example, digital video with CD quality sound, is readily available for theater and home use, the weight and size requirements for use in aircrafts makes it very difficult to incorporate high fidelity systems within an aircraft. This problem is especially pronounced for audio speaker assemblies when one attempts to meet the size, weight and shape requirements for use in aircrafts.

In the aircraft industry great priority is placed upon component weight and size reduction. Range and payload are adversely affected by conventional terrestrial designs. These concerns are notable when one attempts to make changes within smaller private jets. For example, a small increase in the weight carried by an aircraft results in a substantial increase in the fuel consumption of the aircraft. In addition, the limited space available within an aircraft dictates that the use of any space within the aircraft be carefully considered by those responsible for ensuring the comfort of passengers.

Lightweight and compact audio speakers are currently available. These speakers, however, substantially compromise sound quality for reductions in size and weight. An individual wishing to add an audio system to an aircraft must make a choice between high fidelity speakers which do not suit the size and weight requirements of the aircraft and lower quality speakers providing desirable size and weight characteristics.

A need, therefore, exists for a speaker assembly providing high fidelity sound, while also meeting the size and weight requirements of an aircraft. The present invention provides such a speaker assembly.

SUMMARY OF THE INVENTION

It is, therefore, an object of the present invention to provide a speaker assembly including a speaker housing having a closed top wall and an opposed open end, wherein the closed top wall has an inner surface covered by a sound absorbent material. The speaker assembly also includes a first sound source mounted within the speaker housing and directing sound toward the closed top wall of the speaker housing such that desired sound is reflected off the speaker housing toward a listening environment. The first sound source includes a forward side which is spaced from the sound absorbent material to create an air gap between the forward side of the first sound source and the sound absorbent material, wherein unwanted sound emitted by the first sound source is absorbed and phase canceled as a function of the air gap and the sound absorbent material.

It is also an object of the present invention to provide a speaker assembly further including a second sound source mounted within the speaker housing and directing sound toward the closed top wall of the speaker housing such that desired sound is reflected off the speaker housing toward a listening environment. The second sound source includes a forward side which is spaced from the sound absorbent material to create an air gap between the forward side of the sound source and the sound absorbent material, wherein unwanted sound emitted by the second sound source is absorbed and phase canceled as a function of the air gap and the sound absorbent material.

It is another object of the present invention to provide a speaker assembly wherein first electrical connections are coupled to the first sound source for providing the first sound source with a first sound signal and second electrical connections are coupled to the second sound source for providing the second sound source with a second sound signal distinct from the first sound signal.

It is a further object of the present invention to provide a speaker assembly further including a sound filter mounted between the first sound source and the second sound source.

It is also an object of the present invention to provide a speaker assembly wherein the sound source is a midrange driver.

It is another object of the present invention to provide a speaker assembly including a speaker housing within which a sound source and an induction coil are mounted, wherein the induction coil and the sound source are electrically coupled. The speaker housing is provided with a fastening member that securely mounts the induction coil within the speaker housing, while also functioning as an induction core to enhance the performance of the induction coil.

It is a further object of the present invention to provide a speaker assembly wherein the fastening member includes a bolt connected to the speaker housing, and a nut coupled to a free end of the bolt to securely mount the induction coil within the speaker housing.

It is also an object of the present invention to provide a speaker assembly wherein the bolt and nut also support a sound filter and a grill mounting bracket, and the nut draws the sound filter and the grill mounting bracket toward the induction coil to securely mount the induction coil within the speaker housing.

It is another object of the present invention to provide a speaker assembly wherein the fastening member also supports a sound absorptive foam pad.

It is a further object of the present invention to provide a speaker assembly wherein the fastening member also supports a grill mounting bracket.

It is also an object of the present invention to provide a speaker assembly including a speaker housing including a closed top wall and an opposed open end. The speaker assembly also includes a first sound source mounted within the speaker housing and first electrical connections coupled to the first sound source for providing the first sound source with a first sound signal. The speaker assembly is further provided with a second sound source mounted within the speaker housing and second electrical connections coupled to the second sound source for providing the second sound source with a second sound signal distinct from the first sound signal. The first sound source and the second sound source are mounted in opposition within the speaker housing such that the first sound source and the second sound source generate a stereo image.

It is another object of the present invention to provide a speaker assembly wherein the first sound source is a tweeter and the second sound source is a tweeter.

It is a further object of the present invention to provide a speaker assembly wherein the first sound source and the second sound source are mounted between approximately a 25° angle and a 75° angle relative to the open end of the speaker housing.

It is also an object of the present invention to provide a speaker assembly wherein the first sound source and the second sound source are mounted at approximately a 45° angle relative to the open end of the speaker housing.

It is another object of the present invention to provide a speaker assembly including a speaker housing having a sound source mounted within the speaker housing, wherein the sound source is securely mounted within the speaker housing by at least one bolt coupled to the speaker housing. The speaker assembly is also provided with wiring coupled to the sound source and passing through the speaker housing, wherein a strain relief member secures the wiring to the at least one bolt to prevent the inadvertent application of forces on the sound source.

It is a further object of the present invention to provide a speaker assembly wherein the strain relief member is a C-clamp.

It is also an object of the present invention to provide a speaker assembly wherein the strain relief member is plastic.

Other objects and advantages of the present invention will become apparent from the following detailed description when viewed in conjunction with the accompanying drawings, which set forth certain embodiments of the invention.

DESCRIPTION OF THE PREFERRED EMBODIMENTS

The detailed embodiment of the present invention is disclosed herein. It should be understood, however, that the disclosed embodiment is merely exemplary of the invention, which may be embodied in various forms. Therefore, the details disclosed herein are not to be interpreted as limited, but merely as the basis for the claims and as a basis for teaching one skilled in the art how to make and/or use the invention.

Figure 1:
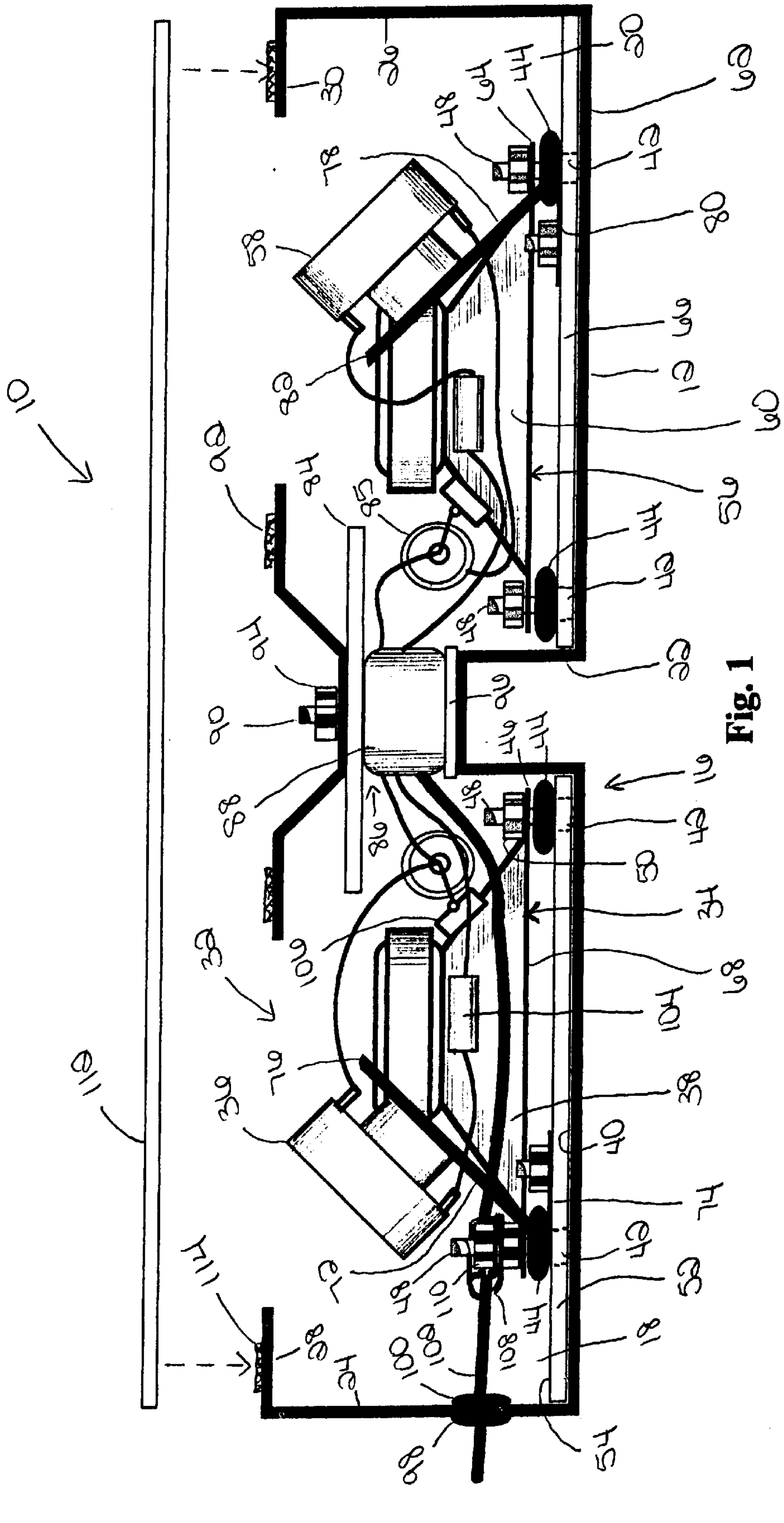
FIG. 1 is a side view of the present speaker assembly.

With reference to FIG. 1, a low profile speaker assembly 10 is disclosed. The speaker assembly incorporates a variety of features which reduce the size and weight of the speaker assembly, without compromising the integrity of the sound generated by the speaker assembly. The speaker assembly is primarily intended for use in aircrafts, where weight and size are critical. While the speaker assembly is preferably designed for use in aircrafts, the speaker assembly may be used in a variety of environments, such as wall enclosed room speakers or within personal computers, without departing from the spirit of the present invention.

The speaker assembly 10 includes a speaker housing 12 within which the acoustic components of the speaker assembly 10 are mounted. The speaker housing 12 disclosed is designed to fit within the space provided within the wall 14 of the aircraft for an oxygen box (see FIG. 2). However, the features of the present speaker assembly could be employed in other housing shapes without departing from the spirit of the present invention.

The speaker housing 12 is preferably constructed from aluminum, although other materials could be employed without departing from the spirit of the present invention. The speaker housing 12 is constructed to include a closed top wall 16 with first and second wells 18, 20 formed therein. The term "top wall" is used throughout the body of the present application based upon the orientation of the speaker assembly as it is currently used within aircrafts. However, it should be understood that this term is not intended to limited possible orientations of the speaker assembly, which may be oriented in a wide variety of manners without departing from the spirit of the present invention.

Acoustic components are mounted within the first and second wells 18, 20 in a manner that will be discussed in greater detail below. A central structure 22 separates the first and second wells 18, 20. The central structure 22 is designed such that the speaker assembly 10 will fit within the space 23 provided in an aircraft for the oxygen box. The speaker housing 12 also includes side walls 24, 26, as well as inwardly directed extensions 28, 30 at the open end 32 of the speaker housing 12. The speaker housing 12 assumes a generally W-shape when viewed from the side. It should be noted that the speaker housing 12 does not include front or rear walls. The lack of these wall reduces the weight of the speaker assembly 10, while also reducing sound cancellation to improve the sound quality of the speaker assembly 10.

The acoustic components are mounted within the speaker housing 12 such that the first set of components positioned within the first well 18 is the mirror image of the second set of components positioned within the second well 20. As will be discussed in greater detail below, the components are wired to produce stereo sound; that is, the first set of components are wired to receive a left channel signal, while the second set of components are wired to receive a right channel signal. The wiring is done in a conventional manner which includes a crossover network 85. While the preferred embodiment is disclosed as providing stereo sound, it is contemplated that the arrangement of components could be varied without departing from certain features of the present invention.

Specifically, a first midrange 34 and a first tweeter 36 are mounted within the first well 18. The midrange 34 is connected to the speaker housing 12 such that the midrange driver 38 faces the top wall 40 of the first well 18. The position of the midrange driver 38 relative to the top wall 40 of the first well 18 is controlled by rubber spacers 42 and rubber grommets 44 positioned between the top wall 40 of the first well 18 and the mounting flanges 46 of the midrange 34. The midrange 34 is securely held in position by bolts 48 extending from the top wall 40 of the first well 18 and nuts 50 coupling the mounting flange 46 of the midrange 34 to the bolts 48 extending from the top wall 40 of the first well 18. Preferably, fiber nuts, for example, NYLOKS™, are used to ensure the nuts do not loosen as a result of the vibrations encountered within an aircraft. In fact, all the nuts used in the present speaker assembly are preferably fiber nuts, although other nuts may be used without departing from the spirit of the present invention.

Sound from the first midrange driver 38 is reflected off the top wall 40 of the speaker housing 12 and out the open end 32 of the speaker housing 12. The sound reflected off the top wall 40 of the first well 18 is controlled by securing a first absorptive foam pad 52, preferably, ⅛" black Safelite™ foam applied with adhesive, to the inner surface 54 of the top wall 40 of the first well 18.

As with the first well 18, a second midrange 56 and a second tweeter 58 are mounted within the second well 20.

The second midrange 56 is connected to the speaker housing 12 such that the second midrange driver 60 faces the top wall 12 of the second well 20. The position of the second midrange driver 60 relative to the top wall 62 of the second well 20 is controlled by rubber spacers 42 and rubber grommets 44 positioned between the top wall 62 of the second well 20 and the mounting flange 64 of the second midrange 56. The second midrange 56 is securely held in position by bolts 48 extending from the top wall 62 of the second well 20 and nuts 50 coupling the mounting flange 64 of the second midrange 56 to the bolts 48 extending from the top wall 62 of the second well 20.

The second midrange driver 60 is also directed toward the top wall 62 of the second well 20 and the sound from the second midrange driver 60 is reflected off the top wall 62 of the speaker housing 12 and out the open end 32 of the speaker housing 12. The sound reflected off the top wall 62 of the second well 20 is controlled by securing a second absorptive foam pad 66, preferably, ⅛" black Safelite™ foam applied with adhesive, to the top wall 62 of the second well 20.

The design of the inverted first and second midranges enhances the sound quality of the speaker assembly, while also reducing the size and weight of the speaker assembly. Specifically, the foam pad, in combination with the air gap between the forward side 68 of the midrange driver and the foam pad, act to absorb and phase cancel unwanted sound from the forward side of the midrange driver. In this way, the sound absorbed and phase canceled in the wells is a function of the foam pad employed and the air gap between the foam pad and the forward side of the midrange driver. The sound ultimately heard from the midrange by an individual is the sum of the lower frequency sound passing through the air gap and the sound coming from the back of the midrange driver.

The sound generated by the speaker assembly may, therefore, be readily controlled by adjusting the air gap and the foam pad to optimize the generated sound by absorbing and phase canceling unwanted sounds. In fact, it has been found that lower frequency sounds are muffled when the forward side of the midrange driver is too close to the foam pad and the absorptive affect of the foam pad is reduced when the forward side of the midrange is moved too far from the foam pad.

In addition to creating a speaker assembly where unwanted sounds may be removed, the inverted positioning of the first and second midranges allows more proximate positioning of the tweeters in both the vertical and horizontal planes. The ability to position the tweeters more proximate reduces the size and weight of the entire speaker assembly. The proximate positioning of the tweeters and midranges provides additional space within the speaker housing to enable an installer to access the speaker housing and bolt the speaker assembly to the headliner 70 of the aircraft (see FIG. 2).

The first tweeter 36 and the second tweeter 58 are respectively mounted within the first well 18 and the second well 20 to produce a true stereo image with minimal "footprint" (that is, a true stereo image is produced with only minimal space needed for mounting the tweeters). As stated above, the first tweeter 36 receives a left stereo signal and the second tweeter 58 receives a right stereo signal. Although the first and second tweeters are closely mounted within a single speaker housing 12, a stereo image is produced by outwardly mounting the tweeters in opposition. Specifically, the tweeters are mounted between approximately a 25° angle and a 75° angle relative to the open end 32 of the speaker housing 12, and preferably at approximately a 45° angle relative to the open end 32 of the speaker housing 12.

The first tweeter 36 is mounted within the first well 18 by a first substantially V-shaped bracket 72, wherein the first end 74 of the first V-shaped bracket 72 is mounted to the top wall 40 of the first well 18 and the second end 76 of the first V-shaped bracket 72 supports the first tweeter 36 at a 45° angle relative to the open end 32 of the speaker housing 12. The second tweeter 58 is mounted within the second well 20 by a second substantially V-shaped bracket 78, wherein the first end 80 of the second V-shaped bracket 78 is mounted to the top wall 62 of the second well 20 and the second end 82 of the second V-shaped bracket 78 supports the second tweeter 58 at a 45° angle relative to the open end 32 of the speaker housing 12. The V-shaped brackets are mounted on the foam pads 52, 66 within the first and second wells to limit vibrations within the assembly.

Orientation of the tweeters in this manner spreads the left and right stereo sounds to produce a true stereo image from a single speaker assembly. The stereo image is produced so long as the individual is within the proximate listening area of the speaker assembly.

The fact that the first and second midranges are not arranged in opposition has a negligible affect upon the stereo image produced by the speaker assembly. Briefly, the sound from the first and second midranges has limited directional characteristics as a result of its lower frequency sound; directionality increases as the frequency of the sound increases. Any directional characteristics in the sound produced by the first and second midranges are assisted by the provision of a sound absorbing foam pad 84 mounted above the central structure 22 of the speaker housing 12. The foam pad 84 helps to isolate the sounds from the first and second midranges.

Controlled driving of the tweeters and midranges is accomplished by a wiring system employing a crossover network 85 and a pair of centrally located audio signal inductors 86 (only one being shown in FIGS. 1 and 2) composed of induction coils 88. With reference to the shown inductor 86, it should be understood that while only one inductor is described below the other inductor is identical in configuration. The induction coil 88 is mounted on the central structure 22 and is held in position by an upwardly extending induction core bolt 90 mounted on the central structure 22. The induction core bolt 90 functions as both an induction core enhancing the performance of the induction coil 88 and as a fastening member securely mounting the induction coil 88 within the speaker housing 12. The induction core bolt 90 is preferably steel, although other materials could be used without departing from the spirit of the present invention.

The induction core bolt 90 is used to securely mount the sound absorbing foam pad 84, grill mounting bracket 92 and induction coil 88 in position on the central structure 22, while also providing an induction core for the induction coil 88. The sound absorbing foam pad 84, grill mounting bracket 92 and induction coil 88 are securely held on the induction core bolt 90 by a nut 94 attached to the top of the induction core bolt 90. The sound absorbing foam pad 84, in combination with another foam pad 96 located between the induction coil 88 and the central structure 22, reduce vibrations within the speaker assembly. By employing an induction core which functions both electromagnetically and structurally, the size and weight of the inductor may be reduced without compromising the sound quality of the speaker assembly.

The feed from the audio equipment driving the speaker assembly 10 is passed into the speaker assembly 10 through a hole 98 formed in the side wall 24 of the speaker housing 12. The hole 98 is provided with a rubber grommet 100 to limit chafing of the speaker wires 102 passing through the hole 98. As those of ordinary skill in the art will appreciate, four speaker wires are preferably employed to transmit the left and right channels required for stereo sound. However, other wiring arrangements could be employed without departing from the spirit of the present invention. The speaker wires 102 passing through the hole are fed to the tweeters 36, 58 and the inductors 86, and connected thereto in a conventional manner. The signals provided by the inductors 86 are then respectively fed to the midranges 34, 56 in a conventional manner by employing a tweeter filter capacitor 104 and a midrange lowpass filter capacitor 106.

Strain relief within the speaker assembly is achieved by the provision of a C-clamp 108 which couples the speaker wires 102 to the speaker housing 12. Specifically, the speaker wires 102 are coupled to one of the bolts 48 mounting the first midrange 34 to the top wall 40 of the first well 18. The speaker wire 102 is secured to a C-clamp 108 which is attached to the bolt 48 by a fiber nut 110. The ability to provide strain relief by coupling the speaker wires to an existing bolt reduces the weight of the speaker assembly, thus improving the ability of the speaker assembly to be used within aircrafts. The weight of the speaker assembly is also decreased by employing a plastic C-clamp (for example, polyethylene) to couple the speaker wire to the bolt. A second C-clamp may also be employed where additional strain relief is required.

Installation of the speaker assembly is completed by mounting the speaker assembly at a desired location such that the open end of the speaker assembly is directed toward the listening environment and the closed top wall of the speaker housing is directed away from the listening environment. Once the speaker assembly is properly mounted, an expanded metal/perforated speaker grill 112 is placed over the open end of the speaker assembly to hide the contents of the speaker assembly and protect the acoustic components found within the speaker housing. The speaker grill 112 is secured to the extensions and grill mounting bracket by a hook and loop fastening 114, although the speaker grill may be secured to the speaker housing in a variety of manners without departing from the spirit of the present invention. In addition, the speaker grill may be secured on the speaker housing prior to installing the speaker assembly at a desired location. The speaker grill should be designed such that it limits interference with sound generated by the tweeters to ensure a high quality stereo sound field.

Figure 2:
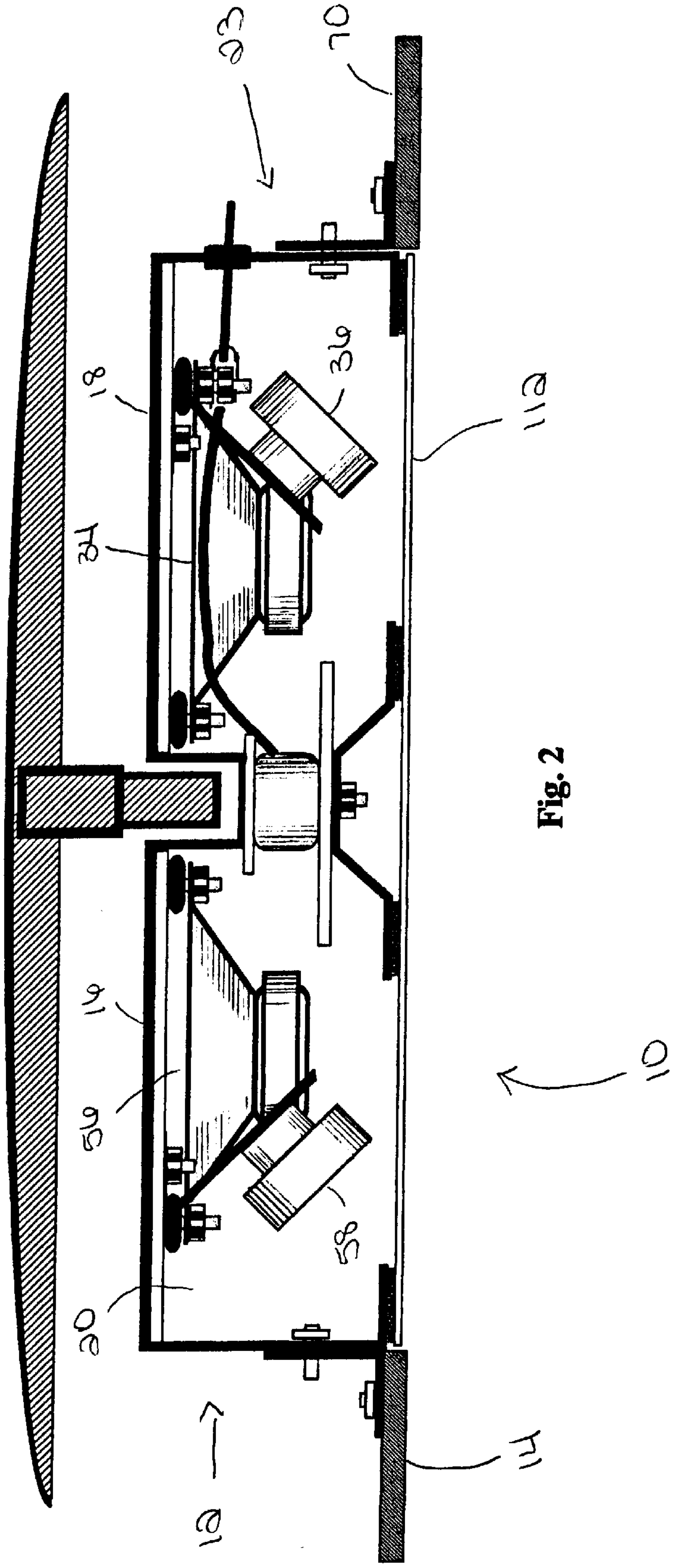
FIG. 2 is a cross-sectional view of the speaker assembly within the wall of an aircraft.

The embodiment disclosed in FIGS. 1 and 2 is designed for placement in the space within an aircraft designed for an oxygen box, and is 4.1" wide, 9.2" long, and 1.875" high. The speaker assembly also weighs only 2.12 pounds and has a radius of curvature of 32" to conform with the space in which must fit.

While the preferred embodiment has been shown and described, it will be understood that there is no intent to limit the invention by such disclosure, but rather, it is intended to cover all modifications and alternate constructions falling within the spirit and scope of the invention as defined in the appended claims.

I claim:

1. A speaker assembly, comprising:

a speaker housing having a closed top wall and an opposed open end wall which freely permits the passage of sound from the speaker assembly, the closed top wall having an inner surface covered by a sound absorbent material;

a first sound source mounted within the speaker housing and directing sound toward the closed top wall of the speaker housing such that desired sound is reflected off the speaker housing toward a listening environment, the first sound source including a forward side which is spaced from the sound absorbent material to create an air gap between the forward side of the first sound source and the sound absorbent material; and wherein unwanted sound emitted by the first sound source is absorbed and phase canceled as a function of the air gap and the sound absorbent material, and the sound ultimately heard freely moves through the open end wall and is the sum of the sound passing through the air gap and the sound from a back side of the first sound source.

2. The speaker assembly according to claim 1, further including a second sound source mounted within the speaker housing and directing sound toward the closed top wall of the speaker housing such that desired sound is reflected off the speaker housing toward a listening environment, the second sound source including a forward side which is spaced from the sound absorbent material to create an air gap between the forward side of the sound source and the sound absorbent material; and wherein unwanted sound emitted by the second sound source is absorbed and phase canceled as a function of the air gap and the sound absorbent material.

3. The speaker assembly according to claim 2, wherein first electrical connections are coupled to the first sound source for providing the first sound source with a first sound signal; and second electrical connections are coupled to the second sound source for providing the second sound source with a second sound signal distinct from the first sound signal.

4. The speaker assembly according to claim 3, further including a sound filter mounted between the first sound source and the second sound source.

5. The speaker assembly according to claim 1, wherein the sound source is a midrange driver.

6. A speaker assembly, comprising:

a speaker housing within which a sound source and an induction coil are mounted, the induction coil and the sound source being electrically coupled; and wherein the speaker housing is provided with a fastening member that securely mounts the induction coil within the speaker housing, while also functioning as an induction core to enhance the performance of the induction coil.

7. The speaker assembly according to claim 6, wherein the fastening member includes a bolt connected to the speaker housing, and a nut coupled to a free end of the bolt to securely mount the induction coil within the speaker housing.

8. The speaker assembly according to claim 7, wherein the bolt and nut also support a sound filter and a grill mounting bracket, and the nut draws the sound filter and the grill mounting bracket toward the induction coil to securely mount the induction coil within the speaker housing.

9. The speaker assembly according to claim 6, wherein the fastening member also supports a sound absorptive foam pad.

10. The speaker assembly according to claim 6, wherein the fastening member also supports a grill mounting bracket.

11. A speaker assembly, comprising:

a speaker housing including a closed top wall and an opposed open end;

a first sound source mounted within the speaker housing and first electrical connections coupled to the first sound source for providing the first sound source with a first sound signal;

a second sound source mounted within the speaker housing and second electrical connections coupled to the second sound source for providing the second sound source with a second sound signal distinct from the first sound signal;

wherein the first sound source and the second sound source are mounted in opposition within the speaker housing such that the first sound source and the second sound source generate a stereo image;

a third sound source mounted within the speaker housing adjacent the first sound source, the third sound source directing sound toward the closed top wall of the speaker housing such that desired sound is reflected off the speaker housing toward a listening location, the third sound source including a forward side which is spaced from sound absorbent material on the inner surface of the top wall to create an air gap between the forward side of the first sound source and the sound absorbent material, wherein unwanted sound emitted by the third sound source is absorbed and phase canceled as a function of the air gap and the sound absorbent material; and a fourth sound source mounted within the sneaker housing adjacent the second sound source, the fourth sound source directing sound toward the closed top wall of the speaker housing such that desired sound is reflected off the speaker housing toward a listening location, the fourth sound source including a forward side which is spaced from sound absorbent material to create an air gap between the forward side of the fourth sound source and the sound absorbent material, wherein unwanted sound emitted by the fourth sound source is absorbed and phase canceled as a function of the air gap and the sound absorbent material.

12. The speaker assembly according to claim 11, wherein the first sound source is a tweeter and the second sound source is a tweeter.

13. The speaker assembly according to claim 11, wherein the first sound source and the second sound source are mounted between approximately a 25° angle and a 75° angle relative to the open end of the speaker housing.

14. The speaker assembly according to claim 13, wherein the first sound source and the second sound source are mounted at approximately a 45° angle relative to the open end of the speaker housing.

15. The speaker assembly according to claim 11, wherein the first and second sound sources are tweeters and the third and fourth sound sources are midranges.

16. The speaker assembly according to claim 11, wherein third electrical connections are coupled to the third sound source for providing the third sound source with a third sound signal; and fourth electrical connections are coupled to the fourth sound source for providing the fourth sound source with a fourth sound signal distinct from the third sound signal.

17. A speaker assembly, comprising:

a speaker housing having a sound source mounted within the speaker housing, the sound source being securely mounted within the speaker housing by at least one bolt coupled to the speaker housing;

wiring coupled to the sound source and passing through the speaker housing, wherein a strain relief member secures the wiring to the at least one bolt to prevent the inadvertent application of forces on the sound source.

18. The speaker assembly according to claim 17, wherein the strain relief member is a C-clamp.

19. The speaker assembly according to claim 17, wherein the strain relief member is plastic.

* * * * *